United States Patent
Kuisma et al.

(10) Patent No.: US 6,938,485 B2
(45) Date of Patent: Sep. 6, 2005

(54) CAPACITIVE ACCELERATION SENSOR

(75) Inventors: Heikki Kuisma, Helsinki (FI); Juha Lahdenperä, Espoo (FI); Risto Mutikainen, Espoo (FI)

(73) Assignee: VTI Technologies Oy, Vantaa (FI)

( * ) Notice: Subject to any disclaimer, the term of this patent is extended or adjusted under 35 U.S.C. 154(b) by 0 days.

(21) Appl. No.: 10/774,688

(22) Filed: Feb. 10, 2004

(65) Prior Publication Data

US 2004/0226374 A1 Nov. 18, 2004

(30) Foreign Application Priority Data

Mar. 5, 2003 (FI) ............................................. 20030338

(51) Int. Cl.⁷ ........................... G01P 15/125; H01G 7/00
(52) U.S. Cl. .................................... 73/514.32; 361/280
(58) Field of Search ......................... 73/514.32, 514.16, 73/514.21, 504.15, 504.12, 514.23, 514.36, 496; 361/280

(56) References Cited

U.S. PATENT DOCUMENTS

| | | |
|---|---|---|
| 5,367,429 A | 11/1994 | Tsuchitani et al. |
| 5,644,455 A | 7/1997 | Schultz ........................ 360/320 |
| 5,939,171 A * | 8/1999 | Biebl .......................... 428/141 |
| 6,318,174 B1 * | 11/2001 | Schmiesing et al. .......... 73/510 |
| 6,404,028 B1 | 6/2002 | Hetrick et al. ............... 257/415 |

FOREIGN PATENT DOCUMENTS

JP 6-213924 8/1994

OTHER PUBLICATIONS

Walter Rydman "Movement of Deuterium in Diamond Foils" Pro Gradu Study, University of Helsinki, Published Dec. 2001; pp. 1–50.

* cited by examiner

Primary Examiner—Hezron Williams
Assistant Examiner—Tamiko Bellamy
(74) Attorney, Agent, or Firm—Squire, Sanders & Dempsey L.L.P.

(57) ABSTRACT

The invention relates to measuring devices used for the measuring of acceleration, and specifically to capacitive acceleration sensors. The capacitive acceleration sensor according to the present invention comprises a pair of electrodes composed of a movable electrode (4) and a stationary electrode (5), and, related to the pair of electrodes, an isolator protrusion having a special coating. The invention provides an improved, more durable sensor structure, which withstands wear caused by overload situations better than earlier structures.

13 Claims, 2 Drawing Sheets

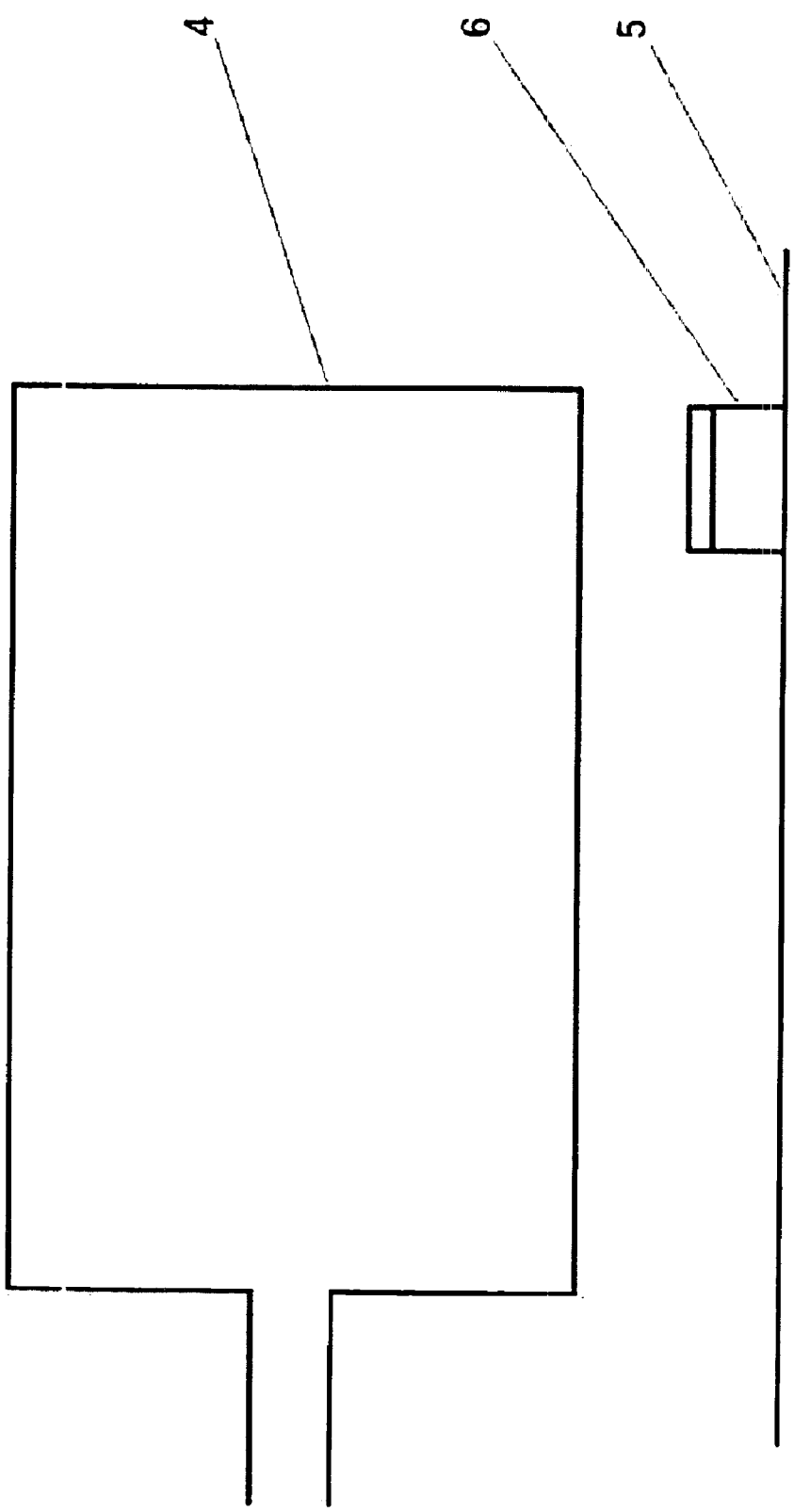

CAPACITIVE ACCELERATION SENSOR

FIELD OF THE INVENTION

The present invention relates to measuring devices used for the measuring of acceleration, and specifically to capacitive acceleration sensors. The invention provides an improved, more durable sensor structure, which better resists the wear caused by overload situations.

BACKGROUND OF THE INVENTION

Measuring based on a capacitive acceleration sensor has proved to have a simple principle and to provide a reliable method for measuring acceleration. The capacitive measuring is based on a change in a gap between two surfaces of a pair of electrodes in the sensor. The capacitance between the surfaces, or the capacity for storing electric charge, depends on the area of the surfaces and the distance between the surfaces. Capacitive measuring can be used already at rather low measuring ranges of acceleration.

The prior art is described below with exemplifying reference to the enclosed FIG. 1, which shows a side view of the structure of a pair of electrodes of an acceleration sensor according to prior art.

FIG. 1 shows a side view of the structure of a pair of electrodes of an acceleration sensor according to prior art. The pair of electrodes of the acceleration sensor according to prior art comprises a movable electrode 1, which moves according to the acceleration, and a stationary electrode 2.

The movable electrode 1 is that part 1 of the acceleration sensor, which is responsive to acceleration, is supported by springs, and due to acceleration moves in relation to the stationary electrode 2. The movable electrode 1 and the stationary electrode 2 constitute a pair of electrodes converting acceleration into a quantity that can be measured electrically, i.e. capacitance. Generally, on the opposite side of the movable electrode 1, the acceleration sensor of prior art also comprises a second pair of electrodes, not shown in the figure for clarity reasons.

In measuring acceleration, the capacitance between the movable electrode 1 and the stationary electrode 2 of the pair of electrodes of the sensor, i.e. the capacity for storing electric charge, depends on the area of the surfaces and the distance between the surfaces. As acceleration through motion is applied to the object to be measured, the stationary electrode 2 follows the movement of the object to be measured. The movable electrode 1 tends to remain in its position due to forces of inertia, and thus moves in relation to the stationary electrode 2. The distance between the movable electrode 1 and the stationary electrode 2, and thus also the measurable capacitance, changes.

The pair of electrodes of a prior art acceleration sensor also comprises an isolator protrusion 3. The pair of electrodes may also have multiple isolator protrusions 3. An isolator protrusion limits the movement of the movable electrode 1, which is supported by springs, and prevents contact between the electrodes 1, 2, in case of overload, and thus also prevents shorting of the meter circuit. The use of an isolator protrusion is described in, for example, the publication U.S. Pat. No. 5,367,429.

Generally dielectric protrusions are used as isolator protrusions 3. In sensitive acceleration sensors the restoring spring forces of the structure are weak, such that surface forces may cause temporary or permanent sticking of the movable electrode 1 to the stationary electrode 2, thus preventing the functioning of the sensor.

In particular, efforts for preventing sticking in surface micro-mechanical acceleration sensors have been made by way of various roughening or coating treatments. For example, surface force reducing films of lipid films or fluoropolymers have been applied to the structures.

In the sensor structures relating to the present invention, there may further occur mechanical wear of the isolator protrusions during the production process. Thus scuffed oxide protrusions get deformed and they can even mechanically lock on to an equally worn silicon surface.

SUMMARY OF THE INVENTION

The object of the present invention is to provide such an improved sensor structure, which prevents sticking between electrodes and which better withstands wear caused by overload situations.

According to the present invention there is provided a capacitive acceleration sensor comprising at least one pair of electrodes, such that the pair of electrodes comprises a movable electrode responsive to the acceleration, at least one stationary electrode, and at least one isolator protrusion, such that the isolator protrusion is coated with a diamond-like DLC coating.

Preferably, the isolator protrusion has a two-layer composite structure, wherein the base layer consists of a material, which is easily applied, which base layer in turn is coated with a top layer of the diamond-like DLC coating.

Preferably, the top layer diamond-like DLC coating also extends onto the sides of the isolator protrusion. Further, preferably, the top layer diamond-like DLC coating also extends past the sides of the isolator protrusion onto the area of the stationary electrode.

Further, preferably, the base layer is essentially thicker than the top layer. Preferably the base layer consists of oxide.

Preferably, the pair of electrodes of the acceleration sensor comprises several isolator protrusions. The isolator protrusions are preferably located on both sides of the movable electrode. Preferably, the isolator protrusions are located on a stationary electrode. Alternatively the isolator protrusions are located on the movable electrode.

Preferably the diamond-like DLC coating for the isolator protrusion is grown by ion beam deposition. Alternatively, the diamond-like DLC coating for the isolator protrusion is grown by plasma enhanced chemical vapour deposition. Alternatively, the diamond-like DLC coating for the isolator protrusion is grown by arc discharge deposition.

Preferably, the quality of the diamond-like DLC coating film for the isolator protrusion has been improved by increasing the proportion of $sp^3/sp^2$ bonds. Preferably, the quality of the diamond-like DLC coating film for the isolator protrusion has been improved by reducing the hydrogen content of the diamond-like DLC coating film.

BRIEF DESCRIPTION OF THE DRAWINGS

The present invention and its preferable embodiments are described below in detail, with reference to the accompanying drawings, of which:

FIG. 2 shows a side view of the structure of a pair of electrodes of an acceleration sensor according to the present invention.

FIG. 1 was described above. The present invention and preferable methods for its implementation are described below with reference to FIG. 2.

DETAILED DESCRIPTION OF THE INVENTION

Figure 1:
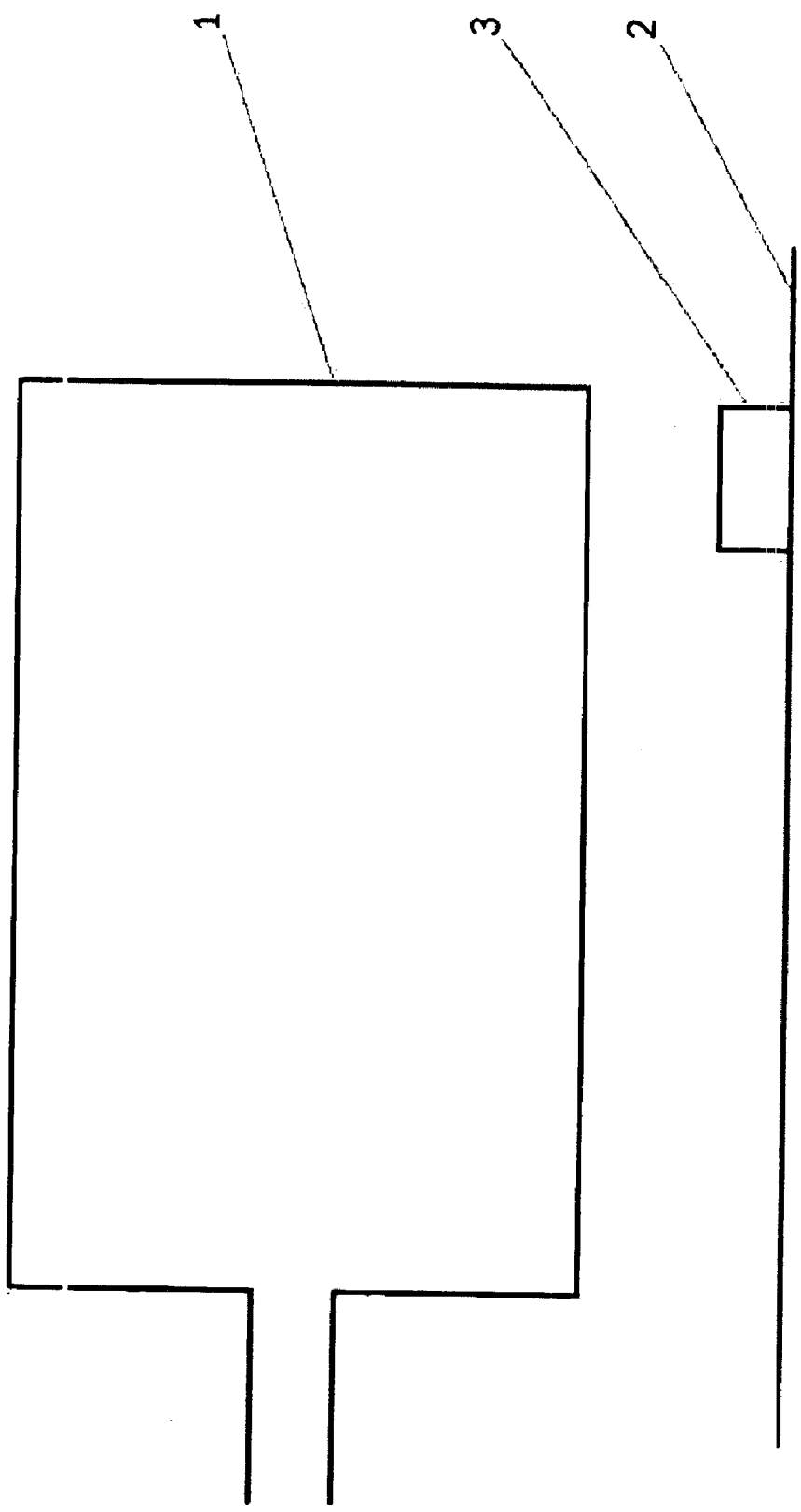
FIG. 1 shows a side view of the structure of a pair of electrodes of an acceleration sensor according to prior art.

In the acceleration sensor according to the present invention, an isolator protrusion of a pair of electrodes is coated with a diamond-like DLC coating (DLC, Diamond Like Carbon). By the solution according to the present invention, the sticking forces can be lowered and the wear of the electrodes can be reduced.

FIG. 2 shows a side view of the structure of a pair of electrodes of an acceleration sensor according to the present invention. The pair of electrodes of the acceleration sensor according to the present invention comprises a movable electrode 4 and a stationary electrode 5. Generally, the acceleration sensor according to the present invention also comprises a second pair of electrodes on the opposite side of the stationary electrode 4, which, for reasons of clarity, is not shown in the figure.

The pair of electrodes of the acceleration sensor according to the present invention further comprises an isolator protrusion 6. The isolator protrusion 6 is coated with a diamond-like DLC coating (DLC, Diamond Like Carbon).

The isolator protrusion 6 according to the present invention is a two-layer composite structure, with a base layer being thicker and made of easily depositable material, e.g. oxide, and said base layer in turn being coated with a thinner top layer of the diamond-like DLC coating. The diamond-like DLC coating of the top layer can extend also onto the sides of the isolator protrusion 6, or also beyond the edges of the isolator protrusion 6 onto the area of the stationary electrode 5. The pair of electrodes of the acceleration sensor according to the present invention may comprise a multitude of isolator protrusions 6. The isolator protrusions can be positioned on both sides of the movable electrode 4. Typically, the isolator protrusion 6 are located on the stationary electrode 5, but alternatively the isolator protrusion can be located on the movable electrode 4.

According to the present invention, the diamond-like DLC coating for the isolator protrusion 6 of the pair of electrodes of the acceleration sensor can be deposited by various methods. The DLC coating can be grown by Ion Beam Deposition, or alternatively, by Plasma Enhanced Chemical Vapour Deposition (PECVD), and further alternatively, by arc discharge deposition.

The quality of the diamond-like DLC coating film on the isolator protrusion 6 according to the present invention can be improved by increasing the proportion of the bonds $sp^3/sp^2$, or alternatively, by reducing the hydrogen content of the diamond-like DLC coating film.

The diamond-like DLC coating of the isolator protrusion 6 of the pair of electrodes of the acceleration sensor according to the present invention is resistant to wear and it provides low surface forces that would cause sticking together of the electrodes.

The surface forces of the two-layered composite structure according to the present invention are lower than in the case of bare oxide protrusions. Thus sticking between the movable electrode 4 and the stationary electrode 5, for example during overload situations, can be avoided.

Wear of the isolator protrusions can be avoided by the solution according to the present invention due to the low friction coefficient and improved resistance to wear of the two-layer composite structure.

By the solution according to the present invention, mechanical wear of the isolator protrusion is prevented during the manufacturing process. By preventing mechanical locking between the electrodes the friction reducing, wear resistant coating according to the present invention improves the behavior of the pair of electrodes of the acceleration sensor.

What is claimed is:

1. A capacitive acceleration sensor comprising at least one pair of electrodes, such that the pair of electrodes comprises a movable electrode responsive to the acceleration, at least one stationary electrode, and at least one isolator protrusion, wherein the isolator protrusion being coated with a diamond-like DLC coating, comprises a two-layer composite structure with a base layer that consists of oxide and the base layer is coated with a top layer of the diamond-like DLC coating.

2. The capacitive acceleration sensor of claim 1, wherein the diamond-like DLC coating of the top layer extends also onto the sides of the isolator protrusion.

3. The capacitive acceleration sensor of claim 2, wherein the diamond-like DLC coating of the top layer also extends beyond the edges of the isolator protrusion onto the area of the stationary electrode.

4. The capacitive acceleration sensor of claim 1, wherein the base layer is essentially thicker than the top layer.

5. The capacitive acceleration sensor of claim 1, wherein the pair of electrodes of the acceleration sensor comprises several isolator protrusions.

6. The capacitive acceleration sensor of claim 1, wherein the isolator protrusions are positioned on both sides of the movable electrode.

7. The capacitive acceleration sensor of claim 1, wherein the isolator protrusions are positioned on the stationary electrode.

8. The capacitive acceleration sensor of claim 1, wherein the isolator protrusions are positioned on the movable electrode.

9. The capacitive acceleration sensor of claim 1, wherein the diamond-like DLC coating of the isolator protrusion is grown by ion beam deposition.

10. The capacitive acceleration sensor of claim 1, wherein the diamond-like DLC coating of the isolator protrusion is grown by plasma enhanced chemical vapour deposition.

11. The capacitive acceleration sensor of claim 1, wherein the diamond-like DLC coating of the isolator protrusion is grown by arc discharge deposition.

12. A capacitive acceleration sensor comprising at least one pair of electrodes, such that the pair of electrodes comprises a movable electrode responsive to the acceleration, at least one stationary electrode, and at least one isolator protrusion, wherein the isolator protrusion being coated with a diamond-like DLC coating,
   wherein the quality of the diamond-like DLC coating film of the isolator protrusion has been improved by increasing the proportion of bonds $sp^3/sp^2$.

13. A capacitive acceleration sensor comprising at least one pair of electrodes, such that the pair of electrodes comprises a movable electrode responsive to the acceleration, at least one stationary electrode, and at least one isolator protrusion, wherein the isolator protrusion being coated with a diamond-like DLC coating,
   wherein the quality of the diamond-like DLC coating film of the isolator protrusion has been improved by reducing the hydrogen content of the diamond-like DLC coating film.

* * * * *